United States Patent [19]

Brunsvold et al.

[11] Patent Number: 5,744,537
[45] Date of Patent: Apr. 28, 1998

[54] ANTIREFLECTIVE COATING FILMS

[75] Inventors: William R. Brunsvold, Poughkeepsie; George J. Hefferon, Fishkill; Christopher F. Lyons, LaGrangeville; Wayne M. Moreau, Wappingers Falls; Robert L. Wood, Poughkeepsie, all of N.Y.

[73] Assignee: International Business Machines Corporation, Armonk, N.Y.

[21] Appl. No.: 863,678

[22] Filed: May 27, 1997

Related U.S. Application Data

[63] Continuation of Ser. No. 516,117, Aug. 17, 1995, abandoned, which is a continuation of Ser. No. 240,289, May 9, 1994, abandoned, which is a continuation of Ser. No. 722,773, Jun. 28, 1991, abandoned.

[51] Int. Cl.$^6$ ............................................. C08L 27/12
[52] U.S. Cl. ..................... 524/520; 524/164; 524/165; 524/319; 524/462; 524/463; 524/503; 524/545; 524/546; 430/273
[58] Field of Search ........................ 524/520, 164, 524/165, 319, 462, 463, 503, 545, 546; 430/273

[56] References Cited

U.S. PATENT DOCUMENTS

| | | | |
|---|---|---|---|
| 3,882,067 | 5/1975 | Petrella | 524/520 |
| 4,263,009 | 4/1981 | Brendle et al. | 8/495 |
| 4,555,543 | 11/1985 | Effenberger et al. | 524/520 |
| 4,557,977 | 12/1985 | Memmer et al. | 524/520 |
| 4,670,503 | 6/1987 | Neumann et al. | 524/520 |
| 4,701,390 | 10/1987 | Grunwald et al. | 430/325 |
| 4,719,146 | 1/1988 | Hohage et al. | 428/331 |
| 4,759,990 | 7/1988 | Y.-T. Yen | 428/421 |
| 4,933,388 | 6/1990 | Blickle et al. | 524/520 |
| 5,104,692 | 4/1992 | Belmares | 427/164 |
| 5,330,883 | 7/1994 | Garza | 430/513 |

FOREIGN PATENT DOCUMENTS

| | | |
|---|---|---|
| 8100923 | 4/1981 | Germany. |
| 62-062520 | 3/1987 | Japan. |
| 2046463 | 11/1980 | United Kingdom. |

OTHER PUBLICATIONS

"J. Electrochem. Soc.", Tanaka et al., 137, 3900–05 1990, Tanaka I; A new Photo lithography technique w/ anti-reflective coating on resist.

"Reflectivity Measurement at the Interface between resist and substrate", T. Tanaka et al., Chem Abs, 107; 87208y (1987).

T. Tanaka, J. Electrochem Soc., 137; pp. 3900–3905 (1990) A new Photo lithography technique u/antireflective coating on Resist.

T. Tanaka, J. Electrochem. Soc., 137 pages 3900–05 (1990) A New Photolithography Technique with Antiflective Coating on Resist: Arcor.

T. Tanaka, et al. J. Appl. Phys. 67, 2617–22 (1990), "A New Method for Reflectivity Measurement at the Interface betwee Resist and Substrate".

T. Tanaka et al, Chem. Abs., 107: 87208y (1987), "Photolithography".

Primary Examiner—Vasu Jagannathan
Assistant Examiner—John J. Guarriello
Attorney, Agent, or Firm—Ratner & Prestia; Steven Capella

[57] ABSTRACT

Enhanced fidelity of pattern transfer of aqueous developable photoresist compositions is achieved with top antirefective coatings which are fluorine-containing and have a refractive index approximately equal to the square root of the underlying photoresist and which are removable in the developer for the photoresist.

5 Claims, No Drawings

ANTIREFLECTIVE COATING FILMS

This application is a continuation of application Ser. No. 08/516,117 filed Aug. 17, 1995, now abandoned, which is a continuation of application Ser. No. 08/240,289, filed May 9, 1994 now abandoned, which is a continuation of application Ser. No. 07/722,773, filed Jun. 28, 1991 now abandoned.

FIELD OF THE INVENTION

This invention relates to compositions which enhance the performance of aqueous developable photoresists by substantially eliminating pattern distortion caused by reflections over non planar features in the workpiece being patterned. More particularly, the invention is directed to antireflective top coatable compositions which are easy to apply, provide better process control of image formation, are aqueous soluble and thus are removable within the existing lithographic processing, and minimize environmental hazards and do not significantly add to process costs.

BACKGROUND ART

The use of antireflection coatings for optical devices such as lenses in photographic and other equipment is well known. These coatings take advantage of the relationship described in the Fresnel formulae. It is well established that the refractive index of an overlying material should be at about the square root of the refractive index of the underlying material and that the thickness of the coating or layer should be an odd integer multiple of one-quarter of the wavelength of the incident radiation, the so-called "quarter-wavelength thickness".

In U.S. Pat. No. 4,759,990 to Y-T. Yen, the antireflective coating concept is extended for use over optical membrane elements, i.e., pellicles, which may be used in the manufacture of semiconductor wafers. The pellicle material is typically a nitrocellulose film which is stretched over a pellicle holder (an upstanding ring or the like). The use of an aromatic vinyl polymer as a first coating layer such as polyvinyl naphthalene, polymethylstyrene or polystyrene, followed by a fluorocarbon layer such as 3M's FC-721 or FC-77 is disclosed. Pellicles may be used a number of times before they suffer either mechanical break down or cover contamination. Such pellicles are either cleaned or reworked/replaced.

Tanaka et al., *J. Electrochem. Soc.*, 137, 3900 (1990) (Tanaka I) provides a technique for directly applying an antireflective coating on top of a resist (ARCOR). This technique seeks to overcome the many problems which have been encountered due to reflectivity when increasing the degree of pattern densification in trying to achieve ULSI having sub-0.5 um geometries.

Light interference leads to linewidth variations and degraded detection of through the lens (TTL) alignment marks. Tanaka I discloses the formation of an antireflective film on a resist surface which is sufficient to suppress the multiple interference effects due to repeated reflection of incident light in the resist film. The ARCOR film is clear and has its thickness and refractive index optimized and is used in a process which entails the steps of coating and baking a photoresist in the conventional way, spin-coating a film of the ARCOR material on the photoresist, imaging the composite structure, removing the ARCOR film, and developing the photoresist. The ARCOR process adds the steps of spin-coating and removal of the ARCOR film. The following materials were characterized:

| ARCOR Material | | Refractive Index* | dLW Factor** |
|---|---|---|---|
| (1) | perfluoroalkylpolyether | 1.29 | 10X |
|  | polysiloxane | 1.43 | 2.5X |
| (2) | polyethylvinylether | 1.48 | 1.7X |
|  | polyvinylalcohol | 1.52 | 1.4X |

*Refractive index in e-line (546 nm), g-line (436 nm) and i-line (365 nm).
**Reduction in linewidth variation due to reflectivity.

Using the Fresnel formulae, Tanaka I determined that the refractive index of the ARCOR material should be about equal to the square root of the refractive index of the imaging resist used. Tanaka I used a resist having a refractive index of 1.64 and the ideal ARCOR refractive index is 1.28. The Tanaka et al. materials fall into two categories: (1) those which suppress reflection effects and which require organic solvent strip; and (2) those which are aqueous strippable, but which provide little process benefit. (Refractive index ≧1.48.)

Tanaka et al., *J. App. Phys.*, 67, 2617 (1990) (Tanaka II) discloses the use of perfluoroalkyl polyether or spin on glass and di-propoxy-bis(acetyl-acetonate)titanium as ARCOR materials for single and bilayer films to control the interface reflectivities as well as the methods to measure such reflectivities. Tanaka II entails the use of baking steps to fix the one and two layer ARCORs disclosed. It is silent as to post exposure and develop methods, if any, to remove the ARCOR layer(s).

Tanaka et al., *Chem. Abs.*, 107:87208y (1987) (Tanaka III) is directed to the subject matter of JP 62 62,520, viz., a process for coating a photoresist with an antireflective coating which may comprise perfluoroalkyl-polyether, perfluoroalkylamine, or perfluoroalkyl-polyether-perfluoroalkylamine mixed film. The reflection-preventive film is removed after pattern wise exposure using a Freon (a chlorofluorocarbon compound) solvent.

The Tanaka materials having the desired refractive indices are more expensive to use. First, there is the required additional process step to remove the ARCOR material. Second, the removal requires an organic solvent which is expensive to make/purchase and requires expense to safely handle and dispose of. Third, the nature of Tanaka's solvents as CFCs requires extreme care to protect against environmental damage. The waste management aspects of the Tanaka reflection-preventative materials weighs heavily against their implementation.

In U.S. Pat. No. 4,701,390 to Grunwald et al., a process for thermally stabilizing a photoresist image layer formed on a substrate is provided, wherein the image layer, prior to being subjected to a post-development bake, is coated with a protective material which bonds to the photoresist, but is readily rinsed from the exposed substrate after post bake and which does not interfere with the desired operation of any of the subsequent steps of pattern generation including final removal of the photoresist image. The protective (thermally stabilizing) material may be a compound or a mixture of two or more compounds selected from chromotropic acid, perfluorocarbon carboxylic acids, perfluorocarbon sulfonic acids, perfluorocarbon phosphoric acids, and alkali metal, ammonium and amine salts of such acids, ethoxylated perfluorocarbon alcohols, and quaternary ammonium salts of N-perfluoro-N',N"-dialkylamines.

SUMMARY OF THE INVENTION

In order to overcome the deficiencies of the materials and top antireflective processes noted in the Background Art, the invention provides coating compositions which provide a refractive index about equivalent to the square root of the refractive index of an underlying photoresist and which may be applied in a single quarter wavelength thickness and which are further removable in the developer for the underlying photoresist.

The preferred top antireflecting coating compositions are binary systems in an appropriate coating solvent wherein there is a film forming polymer binder which is soluble or dispersible in water or aqueous alkaline solutions and a low refractive index fluorocarbon which is soluble or dispersible in water or aqueous alkaline solutions. These components must be compatible with each other and their proportions in the composition are adjusted to provide a film having the desired thickness and index of refraction. The binary systems may be mixtures of the functional components or polymers in which components having different functionalities are reacted together.

DESCRIPTION OF THE PREFERRED EMBODIMENTS

We have discovered that an improved ARCOR method is achievable that adds only one process step to the imaging process that enables the economical manufacturable use of antireflection films in optical lithography process without adding the potential for harmful environmental effects or increased waste disposal costs.

The ARCOR materials are substantially optically transparent to the exposing radiation about UV light which may be in the i-, g-, or h-line band or deep UV. This transparency is necessary to facilitate the patterning of the underlying resist.

Materials For Aqueous Processable, Low Index Coatings

The top anti-reflective (TAR) coatings of the invention are characterized in that they have both optimized the refractive index of the TAR while at the same time maintaining the aqueous processibility of the TAR materials.

To overcome the deficiencies of fluorocarbon polymers which do provide nearly ideal refractive indexes (on the order of 1.3–1.4) but do not offer solubility or strippability in aqueous media, we have tailored a number of different compositions which overcome these deficiencies.

I. Multi-component systems which generally have two components where the film forming composition comprises an admixture of functionalized fluorocarbons with binders that exhibit aqueous solubility, aqueous dispersibility or have aqueous strippability. Two component systems are comprised of a film forming polymer binder which is soluble or dispersible in water or aqueous alkaline solutions, and a low refractive index fluorocarbon compound which is soluble or dispersible in water or aqueous alkaline solutions.

Specific examples of polymer binders: poly (vinylalcohol), poly(acrylic acid), poly(vinylpyrolidone), poly(vinylsulfonic acid Na+ salt), poly(vinylmethylether), poly(ethyleneglycol), poly(alphatrifluoromethyl acrylic acid), poly(vinylmethylether-co-maleic anhydride), poly (ethylene glycol-co-propylene glycol), poly(methacrylic acid).

Specific examples of fluorocarbon compounds: perfluorooctanoic acid- ammonium salt, perfluorooctanoic acid-tetramethylammonium salt, ammonium salts of C-7 and C-10 perfluoroalkyl sulfonic acids (sold under the trade name Fluorad FC-93 and FC-120 respectively), tetramethyl ammonium salts of C-7 and C-10 perfluoroalkyl sulfonic acids, fluorinated alkyl quaternary ammonium iodides (Fluorad FC-135), perfluoro adipic acid, quaternary ammonium salts of perfluoroadipic acid. The components of such compositions can exist as simple mixtures, or may be in the form of salts between the functionalized fluorocarbon and the polymer binder. Examples include mixtures of fluoroalkyl sulfonates, carboxylates, etc., with aliphatic polymers having aqueous solubility such as polyvinyl alcohols or sulfonates, polyacrylic acid and related copolymers, polyethylene and polypropylene glycol homopolymers and copolymers, polyvinyl methyl ether, and polyethyleneimine. An example of a simple mixture is the combination of polyacrylic acid (a water soluble polymer) with a salt of a perfluoro organic acid (such as ammonium perfluorooctanoate). An example of the salt formed between the fluorocarbon and the polymer is that formed by the combination of a perfluoroalkyl quaternary ammonium cation with an anionic polymer such as polyacrylic acid. Additional benefit may be derived by incorporating fluorine in the binder polymer as well.

II. Systems that are comprised largely of a single component that is the result of a condensation reaction between a functionalized fluorocarbon and an aliphatic polymer. One component systems make use of low index polymers which are not soluble in aqueous media initially but are rendered soluble by base catalysis, where the aqueous base developer is the source of the catalyst.

Examples are fluoroalkyl carboxylates or sulfonates of hydroxy functional polymers such as polyvinyl alcohol. Aqueous strippability is facilitated by the hydrolytic instability of the ester linkages. Carbonates, anhydride and related groups are also suitable linkages between the polymer and fluorocarbon groups.

III. Systems which use a catalyst to cleave the bond between a fluorocarbon group and a polymeric binder or to depolymerize a fluoropolymer where the reaction products are aqueous strippable or partly or fully volatile. Other approaches to two component systems include the combination of a polymer binder that is not soluble in aqueous media initially, but is rendered soluble during the process by the action of a catalyst such as an acid, with low index fluorocarbon compounds. Examples of such polymers are polymethacrylic esters such as poly(t-butylmethacrylate), poly(nonafluoro-t-butylmethacrylate). In combination with one of the perfluoroalkyl sulfonic acids listed above, the polymer can be rendered soluble in aqueous solutions by the acid catalyzed cleavage of the ester group during normal resist baking procedures, so that it is easily removed during the resist development step. Other polymers with acid clearable groups such as the t-boc group, can be used in a similar fashion. Examples include materials such fluoro-t-butyl ester or carbonate polymers and fluoroaldehyde polymers with acid catalysts.

EXAMPLE 1

One equivalent of tetramethyl ammonium hydroxide pentahydrate (18 g) was reacted with 0.1 equivalent of perfluorooctanoic acid (41 g) in water, to form tetra methylammonium perfluorooctanoate at a concentration of 5 percent by weight of the solution.

EXAMPLE 2

Poly(acrylic acid) of molecular weight 2000, was dissolved in water at a concentration of 5 percent by weight of the solution.

EXAMPLE 3

10 grams of the solution from Example 1 was added to 5 grams of the solution from Example 2. The mixture was spin coated on a silicon substrate. A highly uniform transparent film of refractive index 1.413 was obtained. The film was easily washed away with water.

EXAMPLE 4

12.5 grams of the solution from Example 1 was added to 5 grams of the solution from Example 2. The mixture was spin coated on a silicon substrate. A highly uniform transparent film of refractive index 1.407 was obtained. The film was easily washed away with water.

EXAMPLE 5

Silicon substrates were coated with a positive working diazonaphthoquinone photoresist. The thicknesses obtained ranged from 10,000–12,000 angstroms. Samples were over coated with the solution from Example 3, forming a layer thickness of 650 angstroms. The samples were exposed to radiation of 3650 angstroms using a GCA step and repeat aligner. The amount of exposure energy required to give complete film removal upon development (dose to clear) was determined. The dose to clear varied 14% over the range of starting resist thicknesses, due to variable reflectivity. For samples without the 650 angstrom over coat, the dose to clear varied by 36% over the range of starting resist thicknesses.

EXAMPLE 6

Silicon substrates were prepared as in Example 5. Samples were patterned on a GCA step and repeat aligner with an exposure wavelength of 3650 angstroms, using a resolution target mask of equal line and space patterns. The size of the resulting photoresist images, of the 0.7 micron mask patterns, were measured with a scanning electron microscope. The size of the images of the 0.7 micron mask pattern varied by 0.06 microns, over the range of starting resist thicknesses, due to variable reflectivity. For samples without the 650 angstrom over coat the size of the images of the 0.7 micron mask pattern varied by 0.15 microns over the range of starting resist thicknesses, due to variable reflectivity. Thus, the image size variation due to changing reflectivity was reduced by a factor of 2.5X using this aqueous processible anti-reflection material.

EXAMPLE 7

Silicon substrates with varying thicknesses of thermally grown $SiO_2$ were prepared and coated with a positive working DQN photoresist. Samples were overcoated with the solution from Example 3. The photoresist was patterned on a GCA step and repeat aligner with an exposure wavelength of 3650 Angstroms, using a resolution target mask of equal line and space patterns. The size of the resulting images, of the 0.5 micron mask patterns were measured with a scanning electron microscope. The size of the images of the 0.5 micron mask pattern varied by 0.04 microns over the range of thermal $SiO_2$ thicknesses due to variable reflectivity. For samples without the 650 Angstrom antireflection overcoat, the size of the images of the 0.5 micron mask pattern varied by 0.18 microns over the range of thermal $SiO_2$ thicknesses, due to variable reflectivity. Thus, the image size variation due to changing reflectivity, was reduced by a factor 4.5× using this aqueous processible antireflection material.

EXAMPLE 8

20 grams of the solution from Example 1 was added to 5 grams of a solution containing 5% by weight poly (methacrylic acid). The solution was spin coated on a silicon substrate. A highly uniform transparent film of refractive index 1.401 was obtained. The film was easily washed away with water.

EXAMPLE 9

A solution was made containing the ammonium salt of a perfluoro 7 carbon sulfonic acid (trade name FC-93 from 3M Co.) and a copolymer of ethylene and propylene oxide (trade name Pluronic F127 from BASF Corp.) in water at a weight ratio of 65:35, with a total solids content of 5% by weight. The solution was spin coated on a silicon substrate. A transparent film of refractive index 1.43 was obtained. The film was easily washed away with water.

While only the preferred embodiments of the present invention are described above, many potential modifications which fall within the generic concept will occur to those skilled in the art upon a reading of the present disclosure. Such modifications which are functionally equivalent to that as herein set forth are within the teaching of the present invention as set forth in the claims which follow.

What is claimed is:

1. An aqueous-soluble, antireflective coating for use on an aqueous developable photoresist composition comprising:
   (a) a film-forming polymeric binder which is soluble in water or aqueous alkaline solutions, said polymeric binder selected from the group consisting of polyvinylalcohol, polyacrylic acid, polyvinylpyrrolidone, polyvinylsulfonic acid, polyvinylmethylether, polyethyleneglycol, polyalpha-trifluoromethyl acrylic acid, polyvinylmethylether-co-maleic anhydride, polyethyleneglycol-co-propyleneglycol, and polymethacrylic acid; and
   (b) a fluorocarbon compound selected from the group consisting of ammonium salts of perfluoroorganic carboxylic acids having from about 6 to about 10 carbon atoms, ammonium salts of perfluoroorganic sulfonic acids having from about 6 to about 10 carbon atoms, and fluoroalkyl quaternary ammonium salts in admixture with said film-forming polymeric binder,
   wherein the antireflective coating has a refractive index approximately equal to the square root of the refractive index of the aqueous developable photoresist composition, and wherein the antireflective coating is soluble in water or aqueous solutions, and wherein the antireflective coating is removable by dissolution in photoresist developer.

2. The antireflective coating of claim 1 which further comprises a solvent which is immiscible with said aqueous developable photoresist composition.

3. The antireflective coating of claim 1 wherein said coating is comprised of a low refractive index fluorocarbon compound selected from the group consisting of perfluorooctanoic acid-tetramethylammonium salt, tetramethyl ammonium salts of C-7 and C-10 perfluoroalkyl sulfonic acids, fluorinated alkyl quaternary ammonium iodides, perfluoro adipic acid, and quaternary ammonium salts of perfluoroadipic acid.

4. The antireflective coating of claim 1 wherein said coating is substantially optically transparent to the exposure radiation for the underlying resist composition.

5. The antireflective coating of claim 1 wherein the antireflective coating has a refractive index in the range of about 1.3 to 1.4.

* * * * *

UNITED STATES PATENT AND TRADE MARK OFFICE
CERTIFICATE OF CORRECTION

PATENT NO. : 5,744,537
DATED : April 28, 1998
INVENTOR(S) : William R. Brunsvold, George J. Hefferon, Christopher F. Lyons, Wayne M. Moreau, Robert L. Wood It is certified that error appears in the above-identified patent and that said Letters Patent is hereby corrected as shown below:

Title page, item [54] and col. 1, line 1,
In the title the word "TOP" should be added in front of the word "ANTIREFLECTIVE" as written in page 1 of the application as filed.

In column 1, line 17, insert "which" after "to apply", and before "provide"

In column 1, line 18, insert "and which" after "image formation", and before "are aqueous"

In column 3, line 55, insert "-" after "alpha" and before "trifluoromethyl"

In column 4, line 46-47, delete the word "clearable" and insert the word "cleavable"

Signed and Sealed this

Twentieth Day of October, 1998

*Attest:*

BRUCE LEHMAN

*Attesting Officer*  *Commissioner of Patents and Trademarks*